United States Patent [19]

Suga

[11] Patent Number: 5,623,104

[45] Date of Patent: Apr. 22, 1997

[54] APPARATUS FOR TESTING POWER PERFORMANCE OF ELECTRIC MOTOR FOR ELECTRIC VEHICLE

[75] Inventor: Hiroshi Suga, Toyoake, Japan

[73] Assignee: Toyota Jidosha Kabushiki Kaisha, Toyota, Japan

[21] Appl. No.: 593,971

[22] Filed: Jan. 30, 1996

[30] Foreign Application Priority Data

Mar. 10, 1995 [JP] Japan ..................................... 7-051385

[51] Int. Cl.⁶ ..................................................... G01L 3/00
[52] U.S. Cl. ..................... 73/862.18; 73/862.17; 73/117
[58] Field of Search ..................... 73/862.18, 862.17, 73/862.09, 117, 117.1; 364/551.01

[56] References Cited

U.S. PATENT DOCUMENTS

| | | | |
|---|---|---|---|
| 3,898,875 | 8/1975 | Knoop et al. | 73/862.18 |
| 4,257,261 | 3/1981 | Ono et al. | 73/862.18 |
| 4,382,388 | 5/1983 | Ono | 73/862.18 |
| 4,422,040 | 12/1983 | Raider et al. | |
| 4,442,708 | 4/1984 | Gable et al. | 73/862.18 |
| 4,672,288 | 6/1987 | Abbondanti | |
| 4,860,231 | 8/1989 | Ballard et al. | |
| 4,965,513 | 10/1990 | Haynes et al. | |
| 5,262,717 | 11/1993 | Bolegoh | |

FOREIGN PATENT DOCUMENTS

| | | |
|---|---|---|
| 59-104571 | 6/1984 | Japan . |
| 59-111071 | 6/1984 | Japan . |
| 3-212194 | 9/1991 | Japan . |
| 4-348289 | 12/1992 | Japan . |
| 6-66653 | 3/1994 | Japan . |

Primary Examiner—Richard Chilcot
Assistant Examiner—Ronald Biegel
Attorney, Agent, or Firm—Oblon, Spivak, McClelland, Maier & Neustadt, P.C.

[57] ABSTRACT

A test motor 2 is controlled by a controller 7 in accordance with travelling pattern (i.e. vehicle speed) data of an electric vehicle. A load motor 3 is controlled by a controller 9 in accordance with a load pattern. A host controller 10 generates the load pattern based on the vehicle speed pattern and factors of the electric vehicle, and synchronously outputs the vehicle speed pattern and the load pattern to the controller 7 and 9, respectively. Data detected by a torque sensor 4 or other measuring element are input to the host controller 10 to generate a two-dimensional map showing the relationship between the motor efficiency and motor output, or between the motor efficiency and revolution speed. Since the load pattern is generated and input in advance without using feedback control, test results can be obtained with high accuracy.

6 Claims, 10 Drawing Sheets

APPARATUS FOR TESTING POWER PERFORMANCE OF ELECTRIC MOTOR FOR ELECTRIC VEHICLE

BACKGROUND OF THE INVENTION

This invention relates to an apparatus for testing electric motor performance, and more particularly to an apparatus for testing the power performance of an electric motor for an electric vehicle.

Generally, when evaluating the performance of an electric motor (hereinafter referred to as a test motor) on a test bench, performance testing is carried out under two different evaluation circumstances, i.e. evaluation under constant conditions (with constant revolution and constant torque) and evaluation under acceleration/deceleration operations. Test driving with acceleration/deceleration operations further includes a simple driving pattern and a mode simulating for actual travel of a vehicle. Under the simulation mode, the motor revolution is controlled so that the vehicle speed indicates a predetermined running pattern (for example, LA#4 mode based on actual driving in Los Angeles, Calif.), while generating a resistance corresponding to an actual running resistance using a load motor.

Controlling of the running resistance is carried out by computing a load on the vehicle based on the revolution of the test motor (i.e. vehicle speed) and outputting the computed load value to the load motor. The load motor has a computing unit for calculating the running resistance in its control system.

Conventionally, several techniques are known for calculating running resistance. One technique is to calculate a load from a load map which is preset in response to a vehicle speed. In this case, the test bench should be provided with an element having an inertia equivalent to the vehicle inertia (e.g. a flywheel) and resistance equivalent to the vehicle speed is applied to the test apparatus as a load.

Alternatively, load may be calculated based on a feedback speed/acceleration of the load motor, vehicle weight, air resistance factor, etc. When carrying out a performance test on a test bench using this technique, feedback speed and acceleration of the load motor must be accurately measured to provide an appropriate load in accordance with the measurement result.

Japan Laid Open (Kokai) H3-212194 discloses a structure of outputting a speed command (torque command) to the test motor in accordance with a travelling schedule of the vehicle, while outputting to the load motor a resistance (torque) corresponding to travelling conditions at the feedback speed and acceleration. Each of the operations are controlled by a microcomputer.

However, in the former technique using a flywheel, the mechanical strength of the test bench must be reinforced in order to mount the flywheel, which causes the test apparatus to become larger as well as more expensive.

On the other hand, in calculating a load based on the feedback speed and acceleration of the load motor (in the latter technique), it is difficult to detect an acceleration with high accuracy due to the influence of discrete errors in digital systems and the influence of noise in analogue systems. The detection error in acceleration may provide an unrealistic load value and prevent the providing of an appropriate running resistance.

Furthermore, presence of time delay is inevitable during the measurement of the fedback speed and acceleration, and it adversely affects reproduction of the measured value. In order to reduce the time delay, the accuracy of the microcomputer must be improved, which results in increased cost.

SUMMARY OF THE INVENTION

This invention was conceived in view of the above-mentioned problems and it is an object of the invention to provide an apparatus for testing the power performance of an electric motor which realizes highly accurate and effective testing of a test motor.

In order to achieve the object, a test apparatus of the invention carries out a power performance test of an electric motor for an electric vehicle by driving an electric motor to be mounted on an electric vehicle and a load motor connected to the electric motor. The test apparatus comprises electric motor control means for controlling the electric motor in accordance with a predetermined travelling pattern of the electric vehicle, load motor control means for controlling the load motor in accordance with a predetermined load pattern, and main control means for synchronously controlling an operation timing of the electric motor control means and the load motor control means.

In this structure, the main controller synchronously controls the electric motor control means and load motor control means in accordance with a predetermined speed pattern and a predetermined load pattern, respectively, rather than using a conventional feedback control to determine a torque for the load motor. Accordingly, control delay arising from a feedback delay is obviated, and also, errors in torque command values caused by detection error in acceleration can be avoided. Consequently, accurate test results of the power performance of the motor are obtained.

The apparatus for testing the performance of the electric motor further comprises means for generating the load pattern based on the travelling pattern and various factors of the electric vehicle. By simply setting the travelling pattern and the values of the electric vehicle factors, the load pattern is automatically generated and performance tests under various travelling conditions are easily realized without complicated process for generating the load pattern.

The apparatus for testing the performance of the electric motor further comprises detection means for detecting at least torque, revolution speed, driving electric current and driving voltage, and map generation means for generating a two-dimensional map showing the relationship between the output torque of the electric motor and the motor efficiency based on the detected values.

The map generation means may generate a two-dimensional map showing the relationship between the revolution speed of the electric motor and the motor efficiency based on the detected values.

By generating a two-dimensional map containing a physical value of the efficiency, the tendency of the motor performance is easily understood.

Other objects and advantages will be apparent from the detailed description of the embodiment with reference to the drawings.

DETAILED DESCRIPTION OF THE PREFERRED EMBODIMENT

Figure 1:
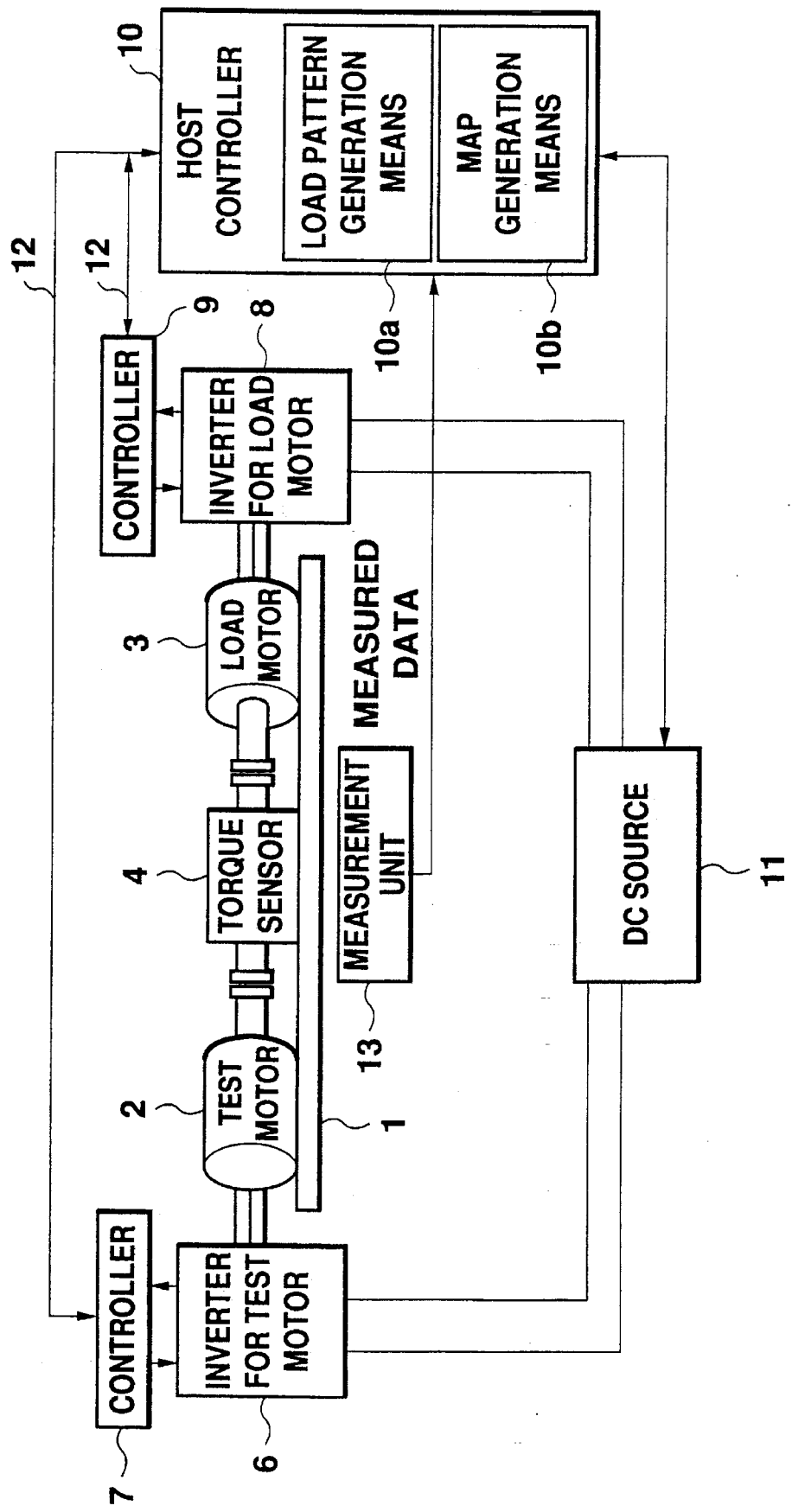
FIG. 1 is a schematic diagram of a test apparatus in accordance with the invention.

FIG. 1 shows a system structure in accordance with one embodiment of the invention. A test motor 2 and a load motor 3, which are mechanically connected to each other through a coupling shaft, are set on a test bench 1. A torque sensor 4 is provided on the coupling shaft to detect an output torque of the test motor 2. An inverter 6 is connected to the test motor 2 and an invertor 8 is connected to the load motor 3. Switching operation of the invertor 6 is controlled by a controller 7 which serves as an electric motor controlling means, while switching operation of the invertor 8 is controlled by a controller 9 which serves as a load motor control means. The inverters 6 and 8 are connected to a DC power source 11 and convert the direct current to alternating current to drive the respective motors 2 and 3. The controllers 7 and 8 are connected via a dedicated data bus 12 to a host controller 10 which serves as a high order main controlling means to generally control the two motors. The host controller 10 comprises a motor interface unit, a measurement control unit, and a display analysis unit which functions as a map generation unit 10b as will be described below. The host controller 10 outputs a high-speed sync signal at an electrically constant time period from the motor interface unit and supplies it via the dedicated data bus 12 to the controllers 7 and 9 for a synchronizing operation command. Since the controllers 7 and 9 generate their own control signal based on the sync signal, the synchronism of the motors 2 and 3 are assured. The high-speed sync signal provides an operation command at a shorter time period than the mechanical time constant of both the motors 2 and 3, which allows various driving patterns ranging from a simple pattern to a complicated operation pattern.

The host controller 10 further includes a load pattern generation unit 10a for calculating a load pattern from the various vehicle factors in the travelling mode, details of which will be described below.

A measure unit 13 is provided to detect various parameters such as a revolution speed, electric current and voltage of the test motor 2. The detection signals from the measure unit 13 as well as a detection signal from a torque sensor 4 are supplied to the host controller 10. The display analysis unit of the host controller 10 calculates an efficiency of the test motor 2 based on the detection signals, and generates and outputs a two-dimensional map of the relationship between the revolution speed and the efficiency (or between the motor output and the efficiency).

Figure 2:
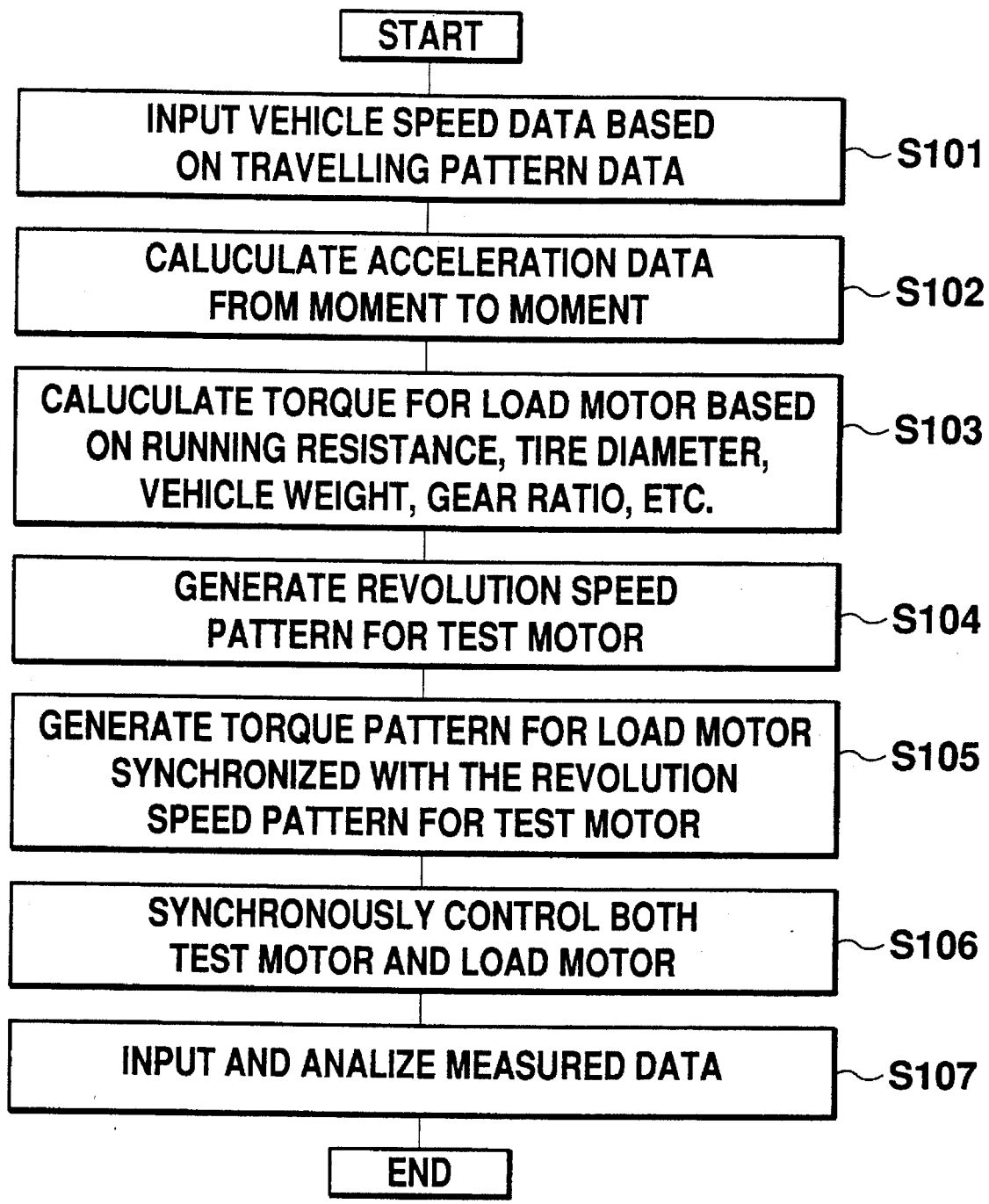
FIG. 2 is a flowchart showing operations of the test apparatus of FIG. 1.

The operation of the test apparatus will now be described with reference to the flowchart of FIG. 2.

Figure 3:
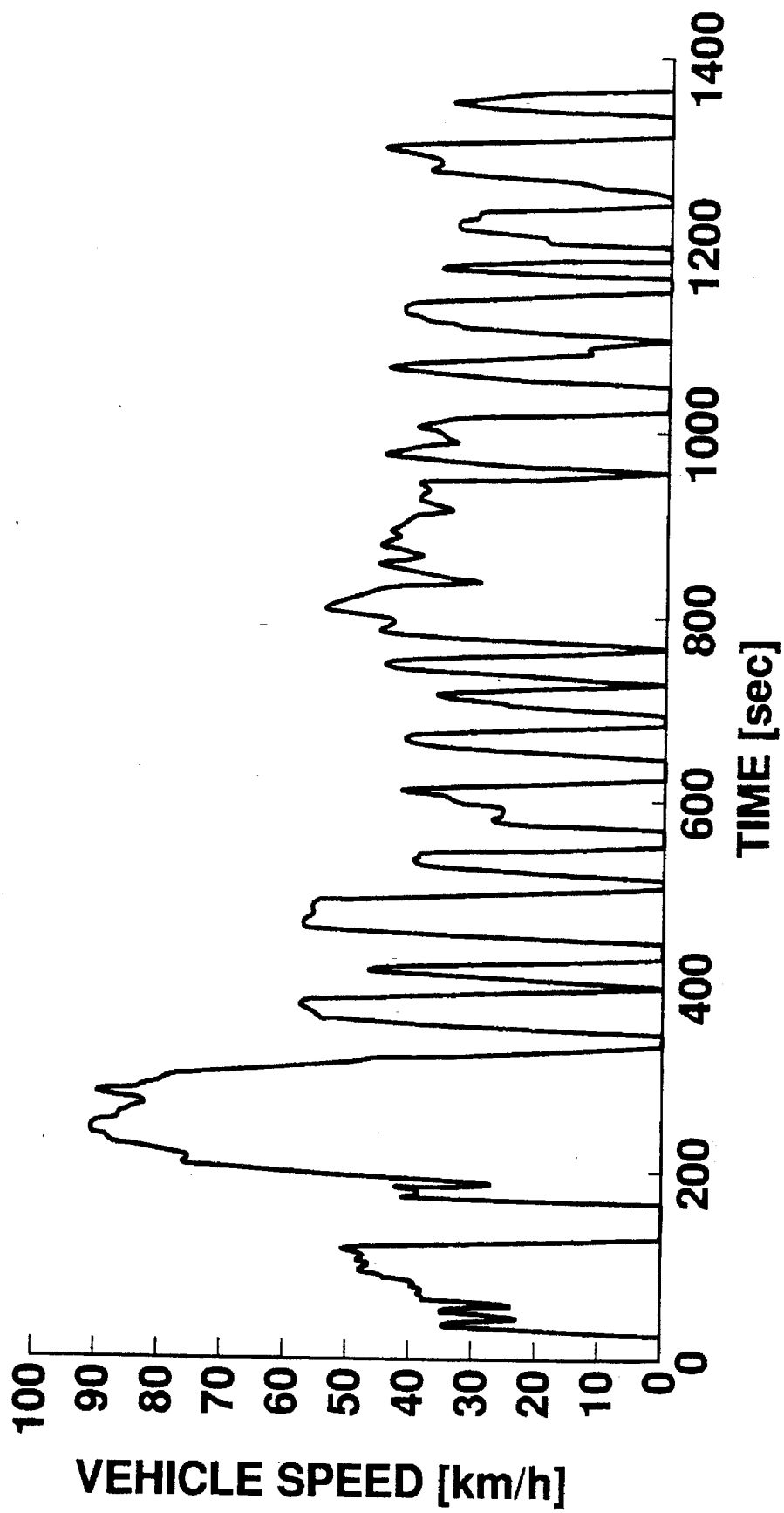
FIG. 3 illustrates a travelling pattern of LA#4 used in the embodiment.

Vehicle speed pattern data is input to the host controller 10 using traveling mode data (S101). In the embodiment, LA#4 mode shown in FIG. 3 is used. The host controller 10 calculates an acceleration data from moment to moment based on the vehicle speed pattern data (S102). More particularly, the acceleration data is obtained by time-differentiating the travelling pattern in FIG. 3. After calculating the acceleration pattern in S102, the host controller 10 calculates a torque, which is to be Supplied to the load motor 3, based on the running resistance, tire diameter, vehicle weight, and gear ratio of the vehicle on which the test motor is mounted (S103). The torque is calculated using the following equation:

Output torque = running resistance + acceleration/deceleration resistance

The running resistance is obtained by either of the following methods.

(A) Mapping Method

Running resistance values corresponding to each of a number of vehicle speeds are input in advance, and a running resistance at a given vehicle speed is obtained by linear interpolation.

(B) Calculation Method I

Running resistance values corresponding to each of a number of vehicle speeds are input in advance, and the constants in the following equation are determined to obtain an approximation curve.

Running resistance = $A + BV + CV^2$ where A, B and C represent constants and V represents vehicle speed.

(C) Calculation Method II

Traveling resistance is calculated in accordance with the following equation.

Traveling resistance = $½ * CD * S * \rho(V/3.6)^2 + g\mu W$ where V is vehicle speed, CD is air resistance coefficient, S is projected front area of vehicle, $\rho$ is air density, $\mu$ is rolling resistance coefficient, W is vehicle weight, and g is the acceleration of gravity.

The present invention is characterized in that the host controller 10 generates a torque in advance which is to be provided to the load motor 3, and either method among (A)–(C) can be used to obtain the traveling resistance.

Acceleration/deceleration resistance may be calculated from the following equation.

Acceleration/deceleration resistance = $W/g * dV/dt$

Figure 4:
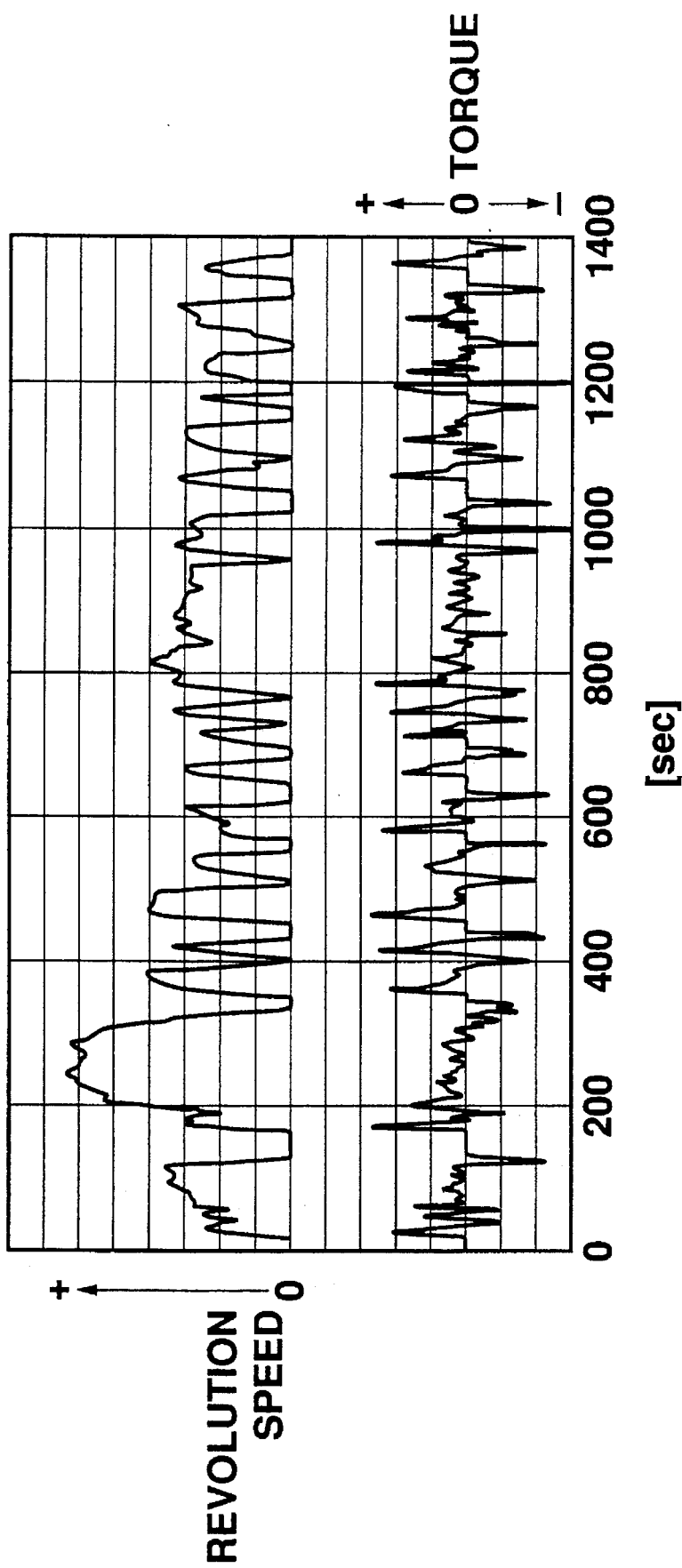
FIG. 4 illustrates a torque pattern used in the embodiment which corresponds to the travelling pattern of FIG. 3.
Figure 5:
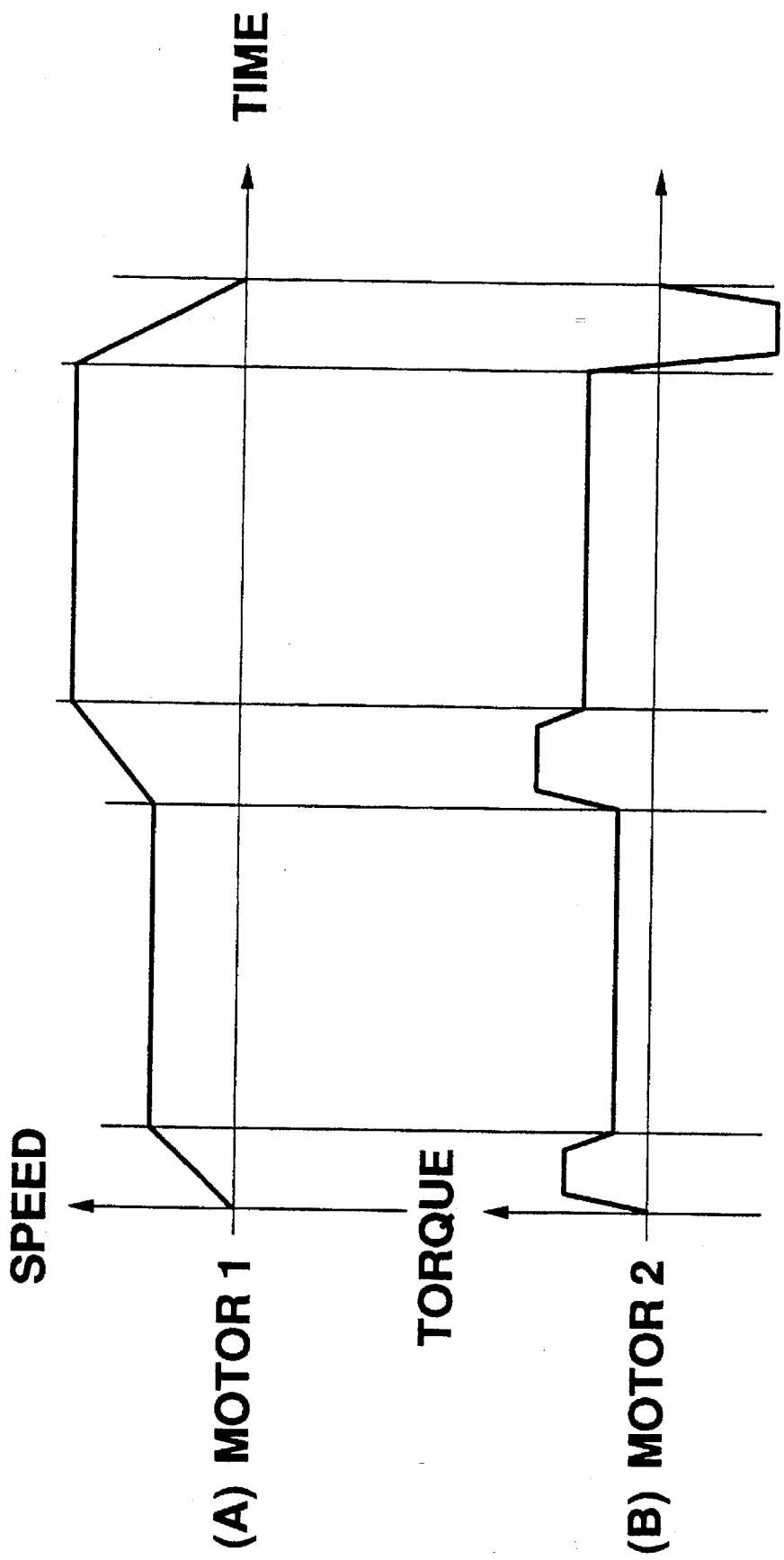
FIG. 5 illustrates a revolution speed and a torque which are output from the host computer 10 to the test motor and load motor, respectively.

After calculating the torque to be sent to the load motor 3, the host controller 10 generates a revolution speed pattern which is to be supplied to the test motor 2 (S104). The revolution speed pattern is generated based on the vehicle speed pattern data input in the step S101. As has been described, in the embodiment, the vehicle speed pattern shown in FIG. 3 is generated based on LA#4 mode. Then, a torque pattern which synchronizes with the vehicle speed pattern of the test motor 2, is generated for the load motor 3 (S105). The torque may be calculated by either of the above-mentioned methods (A) to (C), and an example of the generated torque pattern is illustrated in the lower half of FIG. 4. In FIG. 4, the upper half is a vehicle speed pattern for the test motor 2 represented by a revolution speed (the pattern itself is therefore the same as that of FIG. 3), while the lower half is a torque pattern for the load motor 3 which is synchronized with the vehicle speed pattern. The synchronized vehicle speed pattern and torque pattern are output via the data bus 12 to the test motor 2 and load motor 3, respectively (S106). FIG. 5 shows an example of the vehicle speed pattern and torque pattern output from the host controller 10. FIG. 5(A) is a vehicle speed pattern output to the test motor 2 (actually to the controller 7), and FIG. 5(B) is a torque pattern output to the load motor 3 (actually to the controller 9). Both patterns are synchronized with each other, and therefore, control delay in feedback is dissolved.

In step S107, various data are detected by the torque sensor 4 and other measurement unit 13 while controlling the test motor 2 and load motor 3 in the synchronized manner. The detected data are input to the display analysis unit of the host controller 10 for data analysis (S107). Analysis includes a calculation of the efficiency of the test motor 2 and a mapping of the relationship between the efficiency and motor output or between the efficiency and the motor revolution speed or motor electric current (or voltage) on a two-dimensional map. The efficiency is obtained using the following equation.

$$\text{Efficiency} = \Sigma(T*N)/\Sigma(I*V)$$

where T represents torque, N is revolution speed, I is electrical current, and V is voltage.

Figure 6:
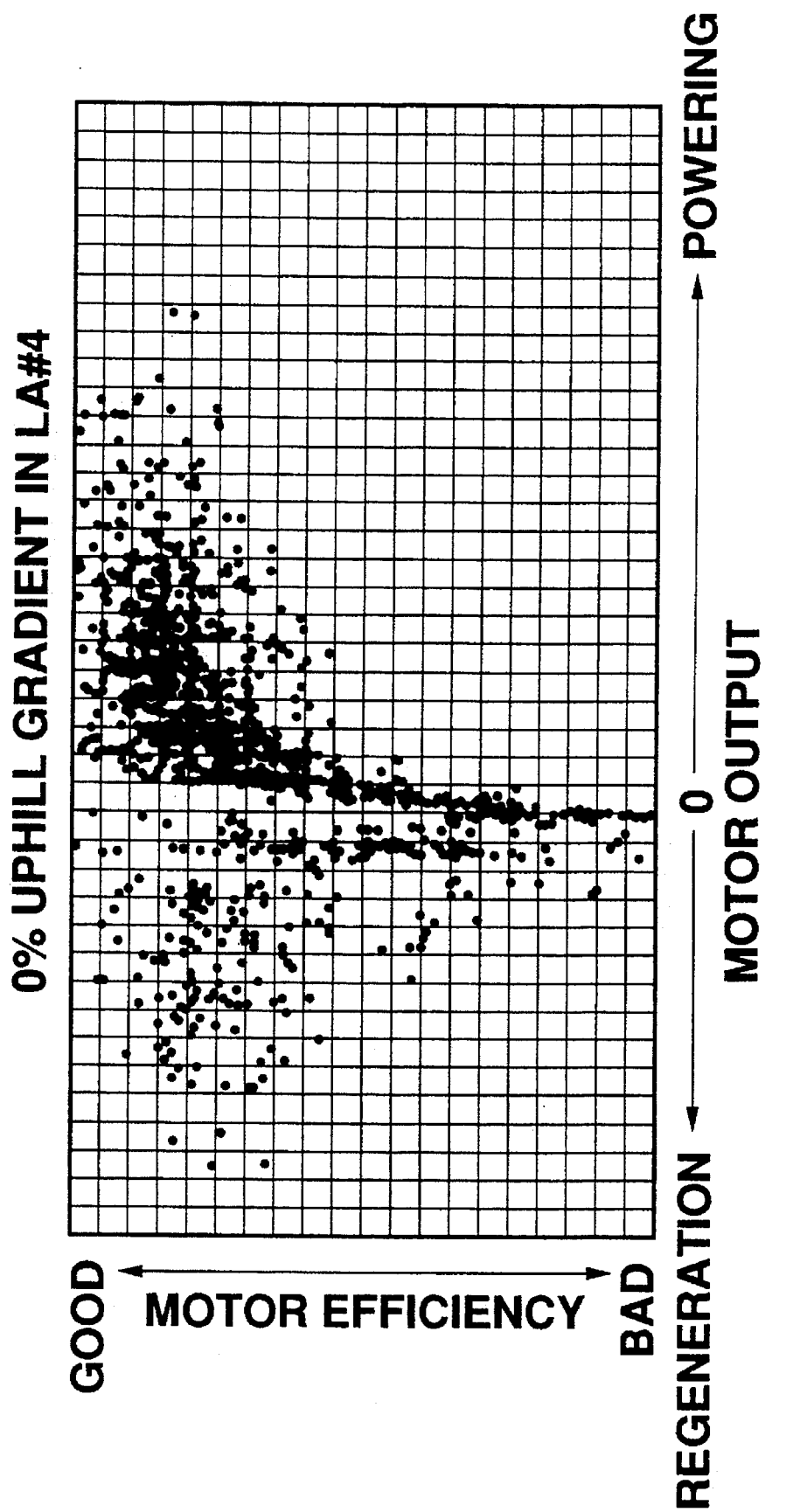
FIG. 6 shows evaluation results for a 0% uphill gradient obtained by the test apparatus in accordance with the embodiment, mapped on a two-dimensional map of motor efficiency vs. motor output.

FIG. 6 shows an example of the relationship between the calculated efficiency and motor output mapped on a two-dimensional map. The horizontal axis represents a motor output (kW) and the vertical axis represents an efficiency (%). Although it is not shown in the figure, each data point on the map bears a number indicating the order in which the data is obtained, and is expressed as time-sequence data on two-dimensional map. Since the vehicle speed for the test motor 2 and torque for the load motor 3 are calculated in advance and are output in a synchronized manner, control delay is substantially eliminated. Furthermore, reduced accuracy in the acceleration detection is avoided and highly accurate data can be obtained in a short time period as well as easy detection of the center of gravity of the motor output. Generally, motor is designed so that a periphery of the center of gravity is optimally designed. By obtaining the evaluation results as shown in FIG. 6, the scope of the optimal design is easily set.

Figure 10:
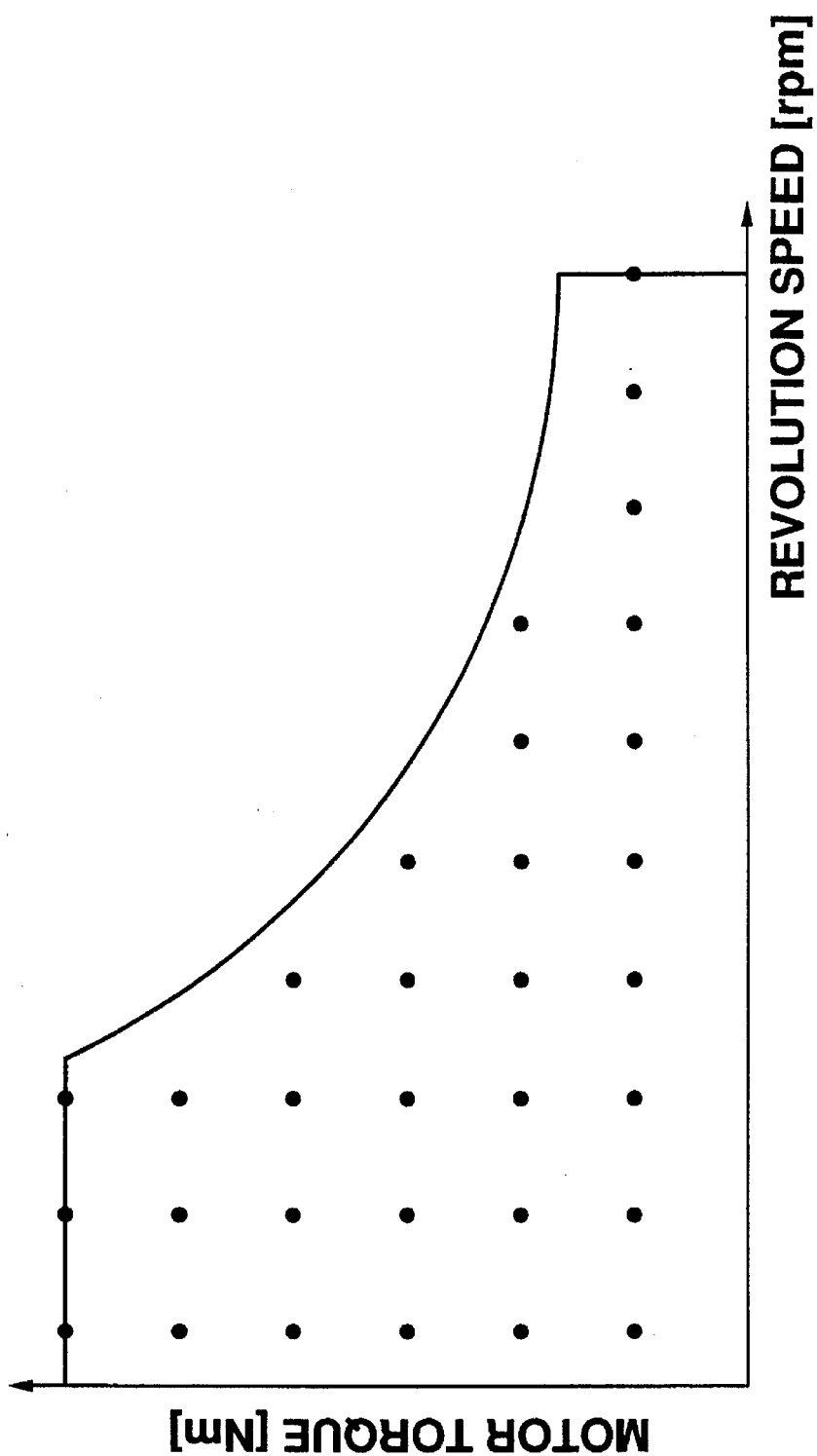
FIG. 10 shows evaluation results obtained by a conventional test apparatus.

FIG. 10 shows an example of test results obtained by a conventional test apparatus, for comparison, where the horizontal axis represents motor revolution speed (rpm) and the vertical axis represents motor torque (Nm). Dots in the chart are measuring points, and motor efficiency is calculated at each of the measuring points. In such a conventional test apparatus, it is difficult to know a tendency of the motor efficiency or causality of energy loss. Comparing this plot with the evaluation results shown in FIG. 6, the advantageous effect of the test apparatus of the invention will be apparent.

Figure 7:
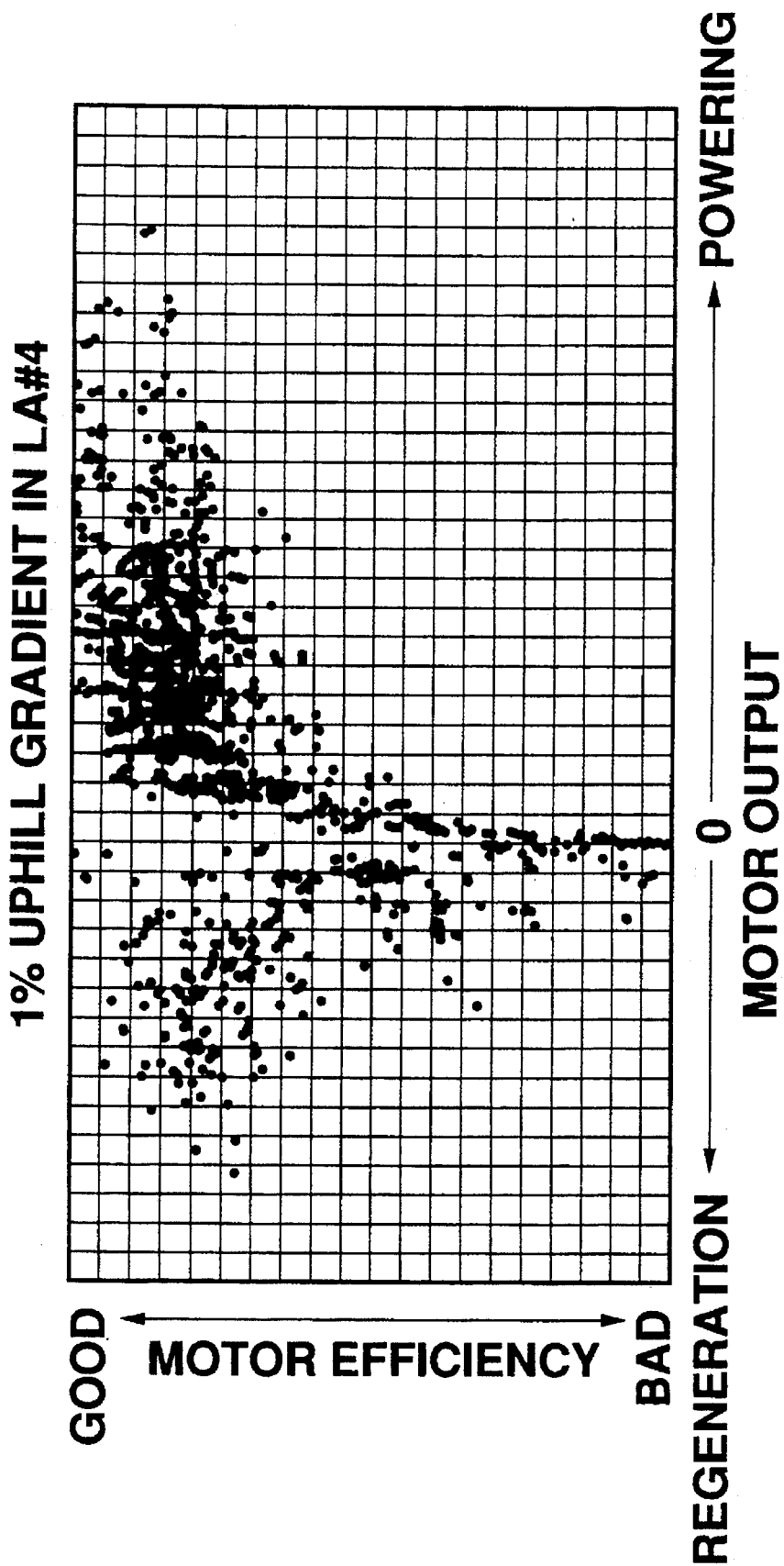
FIG. 7 shows evaluation results for a 1% uphill gradient obtained by the test apparatus in accordance with the embodiment.

Although the evaluation result of FIG. 6 is on the assumption of a 0% uphill gradient in LA#4, the test apparatus of the present invention can easily be applied to any traveling pattern because vehicle speed pattern and torque pattern are calculated and provided to the host controller in advance. For example, FIG. 7 shows an evaluation result of a 1% uphill gradient in LA#4. This test result can be obtained by simply correcting the torque pattern given to the load motor for a 0% uphill gradient.

Figure 8:
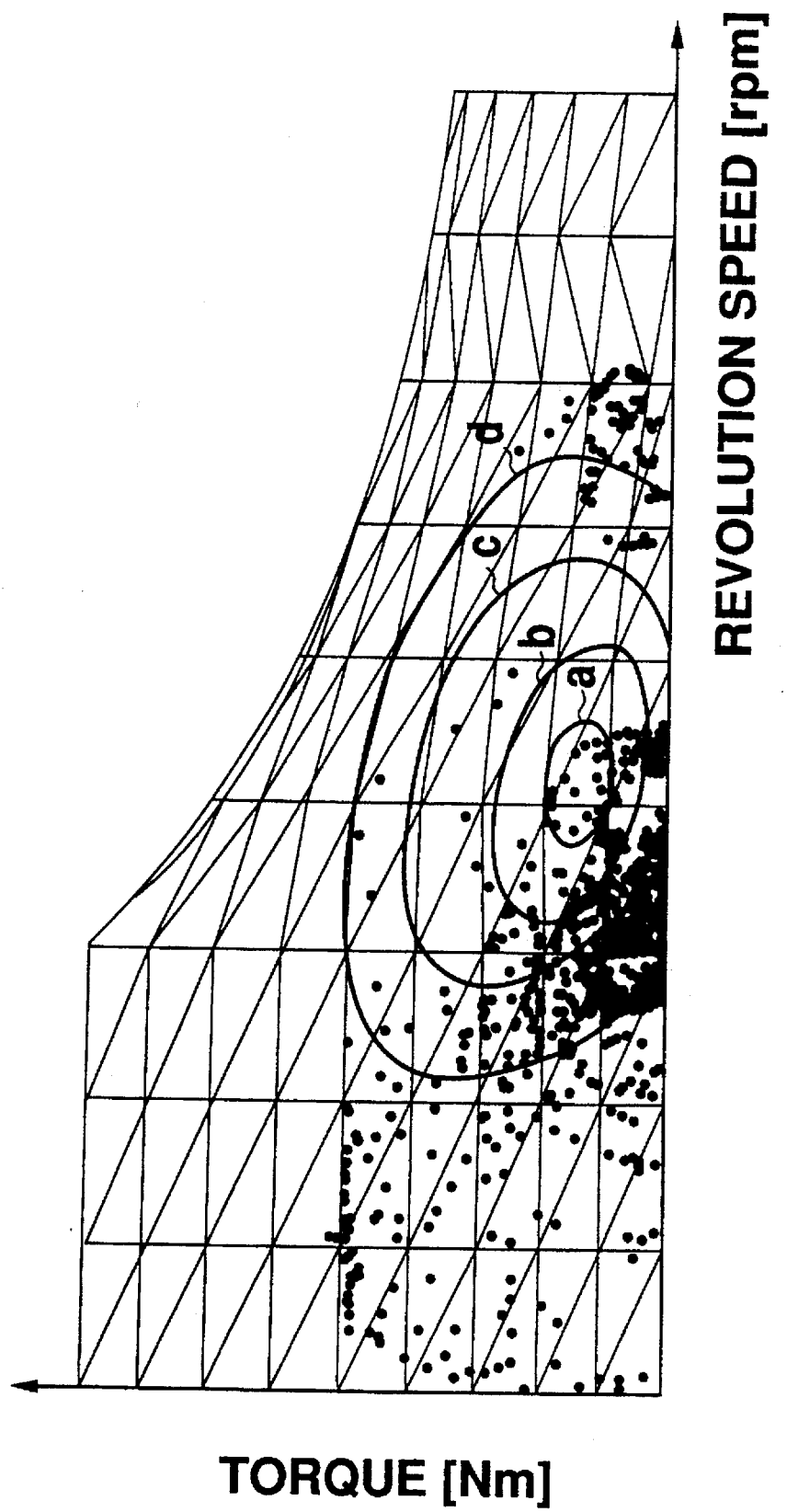
FIG. 8 shows another display example of evaluation results mapped on a graph with torque vs. revolution speed.

FIG. 8 illustrates more evaluation results showing a motor efficiency distribution for each given time, with revolution speed as a horizontal axis and output torque as a vertical axis. Although a three-dimensional graphic is generally used for expressing the relationship among the revolution speed, torque and efficiency, FIG. 8 two-dimensionally expresses the relationship by plotting the efficiency with different colors for each levels. The region "a" is plotted in red, the region "b" is plotted in orange, the region "c" is plotted in yellow, and the region "d" is plotted in yellow-green. The efficiency is decreased in the order of red, orange, yellow and yellow-green. Thus, the efficiency distribution of the motor is graphically expressed as isobaric lines and is easily and visually analyzed. If abnormal color distribution appears on the graph, it is determined that there is something wrong with the motor and the motor can be quickly checked and redesigned. Similar to FIG. 6, each data point may bear a number showing the order of the measurement.

Figure 9:
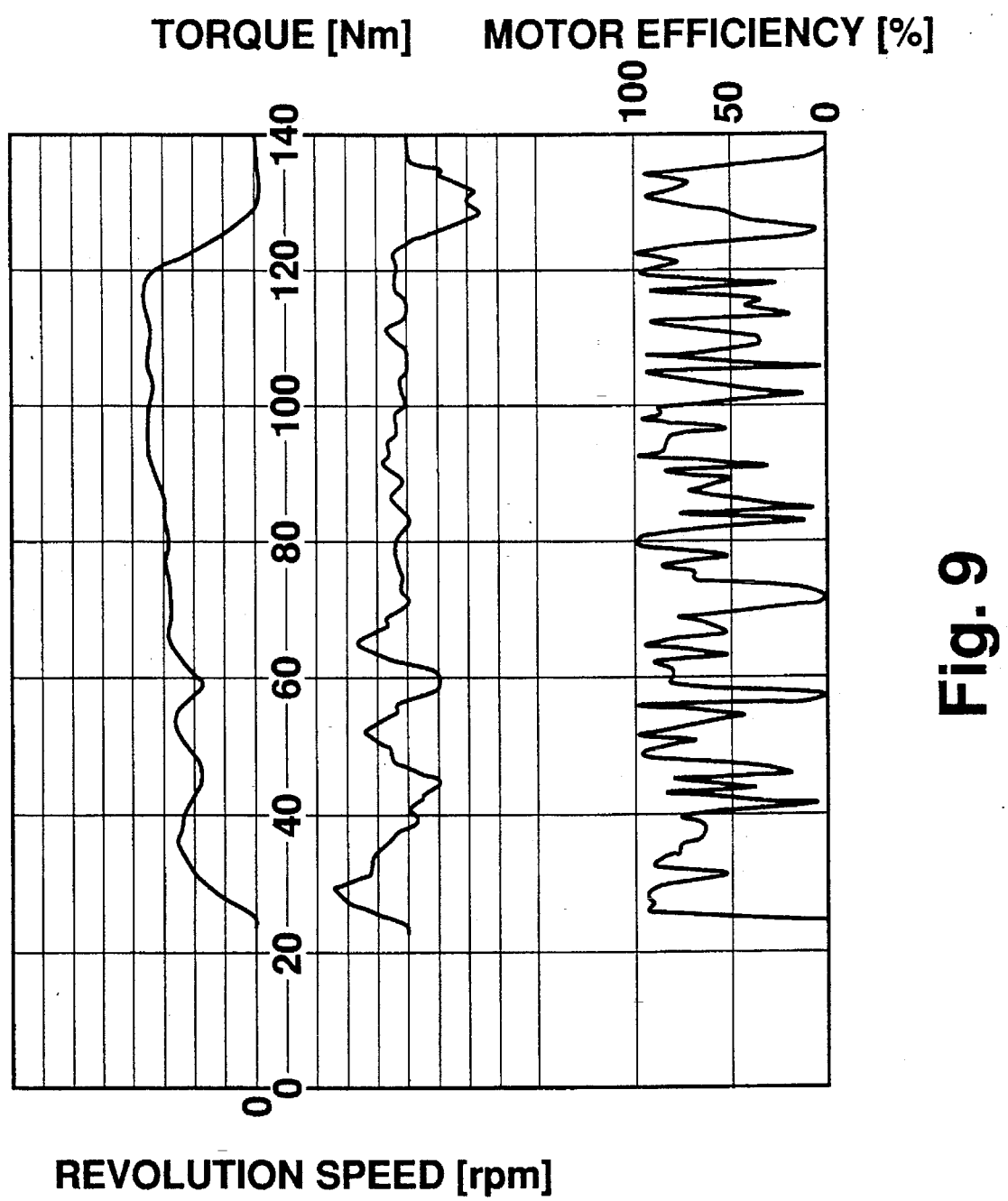
FIG. 9 shows still another display example of evaluation results showing torque, revolution speed and motor efficiency.

FIG. 9 shows another graph showing the evaluation results. The horizontal axis represents time and the vertical axis represents revolution speed, torque, and efficiency. In this graph, the relationships between revolution speed and time, between output torque and time, and between efficiency and time are incorporated in the same two-dimensional area, and the revolution speed, output torque and motor efficiency are associated with each other on a time basis. Therefore, it is easily and quickly determined which driving pattern leads to the reduced efficiency.

Three preferred examples of displaying the evaluation results have been shown above. However, since one of the features of the invention is to create the two-dimensional map containing a physical amount of motor efficiency, other display methods are also included in the scope of the present invention as long as they show the relationship between motor efficiency and other parameters such as torque or revolution speed.

What is claimed is:

1. An apparatus for testing the power performance of an electric motor for an electric vehicle by driving the electric motor to be mounted on the electric vehicle and a load motor connected to the electric motor, comprising:

electric motor control means for controlling the electric motor in accordance with a predetermined travelling pattern of the electric vehicle said traveling pattern having at least one acceleration or deceleration portion;

load motor control means for controlling the load motor in accordance with a predetermined load pattern; and main control means for synchronously controlling the operation timing of the electric motor control means and the load motor control means.

2. The apparatus according to claim 1, further comprising means for generating the load pattern based on the travelling pattern and factors of the electric vehicle.

3. The apparatus according to claim 2, wherein said load pattern is an addition of a running resistance and an acceleration/deceleration resistance of the electric vehicle.

4. The apparatus according to claim 3, wherein the acceleration/deceleration resistance is calculated based on the acceleration obtained by time-differentiating a vehicle speed of the travelling pattern.

5. The apparatus according to claim 1, further comprising:

detection means for detecting at least a torque, revolution speed, driving electric current, and driving voltage of the electric motor; and map generation means for generating a two-dimensional map showing the relationship between the output and efficiency of the electric motor based on the detected values.

6. The apparatus according to claim 1, further comprising:

detection means for detecting at least a torque, revolution speed, driving electric current, and driving voltage of the electric motor; and map generation means for generating a two-dimensional map showing the relationship between the revolution speed and efficiency of the electric motor based on the detected values.

* * * * *